United States Patent [19]

Legory et al.

[11] 4,377,863

[45] Mar. 22, 1983

[54] SYNCHRONIZATION LOSS TOLERANT CYCLIC ERROR CHECKING METHOD AND APPARATUS

[75] Inventors: John E. Legory, Paoli; Dana A. Gryger, Downingtown; Daniel P. Drogichen, West Chester, all of Pa.

[73] Assignee: Burroughs Corporation, Detroit, Mich.

[21] Appl. No.: 184,661

[22] Filed: Sep. 8, 1980

[51] Int. Cl.³ .............................................. G06F 11/10
[52] U.S. Cl. ......................................... 371/42; 371/2; 371/47
[58] Field of Search ............................... 371/42, 47, 2

[56] References Cited

U.S. PATENT DOCUMENTS

| | | | |
|---|---|---|---|
| 3,398,400 | 8/1968 | Rupp et al. | 371/42 |
| 3,466,601 | 9/1969 | Tong | 371/42 |
| 3,471,830 | 10/1969 | McRae et al. | 371/47 |
| 3,560,924 | 2/1971 | McBride | 371/42 |
| 3,753,228 | 8/1973 | Nickolas et al. | 371/47 |
| 4,059,825 | 11/1977 | Greene | 371/42 |
| 4,283,786 | 8/1981 | Okamura | 371/2 |

OTHER PUBLICATIONS

Ide and Sawtschenko, Data Synchronism Checking, IBM Technical Disclosure Bulletin, vol. 7, No. 12, May 1965, pp. 1162-1163.
Bahl and Tang, Shortened Cyclic Code etc., IBM Technical Disclosure Bulletin, vol. 16, No. 6, Nov. 1973, pp. 2028-2030.

Primary Examiner—Charles E. Atkinson
Attorney, Agent, or Firm—L. C. Brenner; M. L. Young; K. R. Peterson

[57] ABSTRACT

In a data processing system wherein a binary data message is protected by cyclic check codes, synchronization loss tolerance is incorporated by performing a binary transformation after encoding the message but prior to transmitting it or writing it to storage and by performing an inverse binary transformation upon receiving it or reading it from storage but prior to error checking. In one embodiment the transformation involves complementing a plurality of bits. In an alternate embodiment the transformation involves reversing the sequence of a plurality of contiguous bits.

12 Claims, 8 Drawing Figures

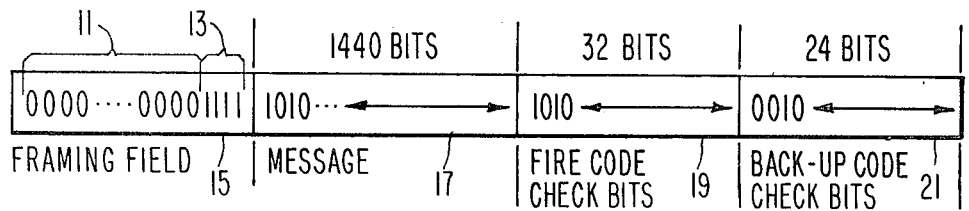
Fig.1
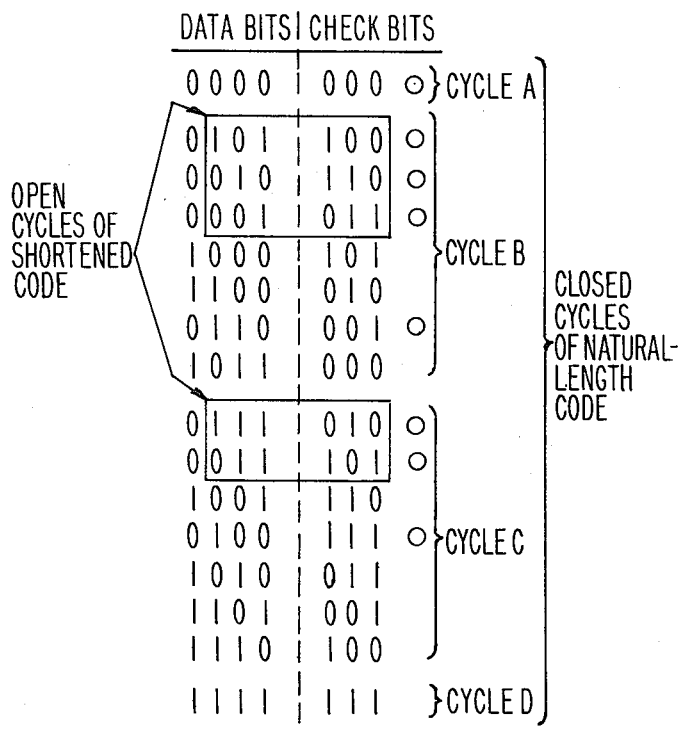
Fig.2
Fig.3
"o" INDICATES CODE VECTORS OF SHORTENED CODE
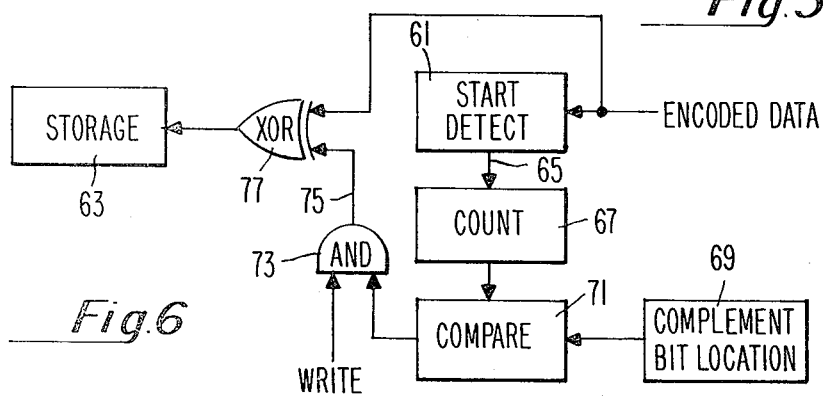
Fig.6

Fig. 5

| DESIG-NATION | 1472-BIT DATA FIELD FOR BACK-UP CODE | 24 BACK-UP CODE CHECK BITS |
| --- | --- | --- |
| | 1440-BIT MESSAGE | 32 FIRE CHECK BITS | |
| a | 1 0 1 1 0 ←→ 0 0101 0011 1101 1000 0000 0010 1001 1100 0000 0111 0001 1111 1000 1010 |
| b | 1 1 0 1 1 0 ←→ 0 0010 1001 1110 1100 0000 0001 0100 1110 0000 0011 1000 1111 1100 0101 |
| c | 0 1 0 1 1 0 ←→ 0 0010 1001 1110 1110 0000 0001 0100 1110 0000 0011 1000 1111 1100 0101 |

Fig. 4

| DESIGNATION | DATA: 1440 BITS | CHECK: 32 BITS |
| --- | --- | --- |
| 0 | 0 ←→ 0 | 0 |
| 1 | 0 01 | 0100 0000 0010 0000 0000 0000 0000 0001 |
| 2 | 0 010 | 1000 0000 0100 0000 0000 0000 0000 0010 |
| 3 | 0 011 | 1100 0000 0110 0000 0000 0000 0000 0011 |
| 4 | 0 0100 | 0100 0000 1010 0000 0000 0000 0000 0101 |
| 5 | 0 0101 | 0000 0000 1000 0000 0000 0000 0000 0100 |
| 6 | 0 0110 | 1100 0000 1110 0000 0000 0000 0000 0111 |
| 7 | 0 0111 | 1000 0000 1100 0000 0000 0000 0000 0110 |
| 8 | 0 01000 | 1000 0001 0100 0000 0000 0000 0000 1010 |
| 9 | 0 01001 | 1100 0001 0110 0000 0000 0000 0000 1011 |
| 10 | 0 01010 | 0000 0001 0000 0000 0000 0000 0000 1000 |

PARALLEL-TO-SERIES REGISTERS

SYNCHRONIZATION LOSS TOLERANT CYCLIC ERROR CHECKING METHOD AND APPARATUS

BACKGROUND OF THE INVENTION

The present invention relates generally to error detection in data processing systems and more particularly to the detection of loss of the synchronization of data being protected by cyclic redundancy checking codes.

Data is frequently protected by a Fire Code to correct bursts of errors and by a back-up code for pure error detection and to insure against mistaken corrections by the Fire Code. For example, data stored on commercially available magnetic disks are commonly protected by Fire Codes which can correct bursts of up to eleven (11) bits or less. Back-up codes are also used for pure error detection and to prevent mistaken corrections by the Fire Code.

In order to facilitate synchronization, every sector on the disks is sometimes preceded by a set of framing bits which may comprise, for example, a string of zeroes and four ones. A media defect occurring in the area of the framing bits can cause the disk-reading circuitry to "see" one or more extra ones. This has the same effect as one or more right shifts of the data and check-bit fields comprising the sector.

Both check codes are based on cyclic codes. In a cyclic code an end-around shift, right or left, always produces another code vector; that is, a vector which is seen by the error-protection logic as an error-free vector. Because of this property, a loss of synchronization on a disk can have the undesirable result that the data error caused by a right shift is corrected (mistakenly) by the Fire Code, and this mistaken correction is not detected by the back-up code. Another possible undesirable result, which is more unlikely than the first, is a left shift.

It is an object of the present invention to assure detection of loss of synchronization of data protected by cyclic check codes.

It is another object of the present invention to assure detection of loss of synchronization of data with minimum hardware and software additions and modifications to existing systems having vulnerability to synchronization loss, and without requiring any increase in the amount of stored or transmitted data.

SUMMARY OF THE INVENTION

The above and other objects of the invention are realized through a method and apparatus operating upon data protected by cyclic redundancy checking codes. Following encoding but prior to transmission or writing to storage a plurality of bits are transformed by inversion, sequence reversal and/or other permutation. Following transmission or reading from storage but prior to decoding or checking, the inverse transformation is performed. If synchronization has been maintained, the original data and checking codes are restored; else, a double error (one on writing and one on reading) will have been introduced and the checking codes will clearly flag the loss of synchronization.

BRIEF DESCRIPTION OF THE DRAWINGS

The above objects, advantages and features of the present invention will become more readily apparent from a review of the following specification in relation with the drawings wherein:

FIG. 1 is an illustration of a data format protectable from loss of synchronization by the present invention;

FIG. 2 is an example in tabular format of a cyclic code of the type utilized in the present invention;

FIG. 3 is a presentation of the code of FIG. 2 rearranged to more clearly show the cyclical nature thereof;

FIG. 4 is an example in tabular format of a cyclic code of the type utilized in the present invention;

FIG. 5 illustrates the code format of FIG. 4 with an additional 24 back-up cyclic code check bits;

FIG. 6 is an illustration of the operation of the present invention functioning to invert two bits following encoding but prior to writing to storage;

DESCRIPTION OF THE PREFERRED EMBODIMENT

Figure 7:
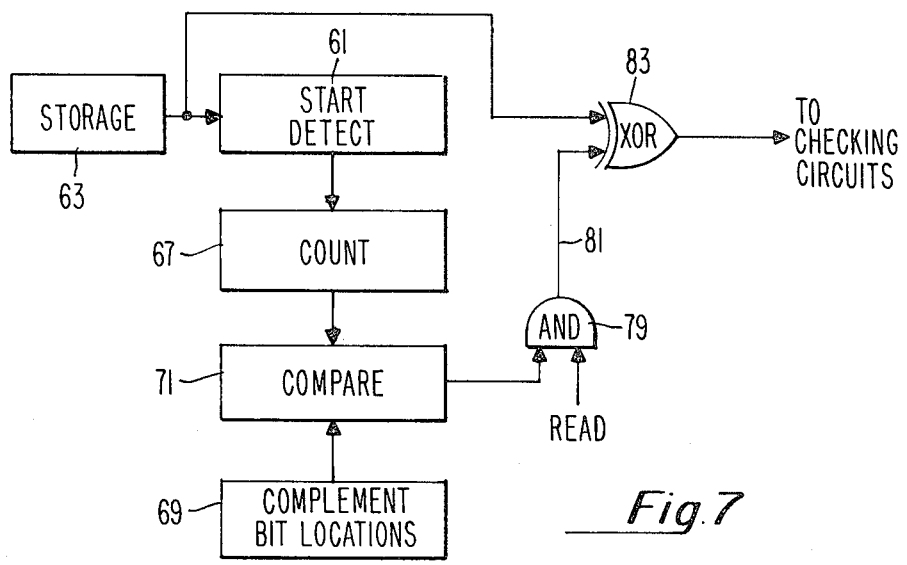
FIG. 7 is an illustration of the operation of the present invention functioning to reinvert two bits following reading from storage but prior to decoding.

The present invention has utilization in a data processing system employing error checking codes to protect data, particularly those systems wherein loss of synchronization is a possible error mode which results in an apparent shift of data of one or more bits and wherein the error checking code or codes protecting the data are based on cyclic codes.

In the preferred embodiment, see FIG. 1, protected data will be preceded by a string of zeroes 11 followed by a string of ones 13 which together form the framing bits 15 to facilitate the synchronization for the data message field 17 which follows. The data message field 17 is followed in turn and protected by a Fire Code Field 19 and a Back-up Code Field 21. The Fire Code Check Field 19 is utilized to correct bursts of errors wherein a burst is defined as a string of one or more contiguous bits in which at least the first and last bits thereof are in error. Typical Fire Code Check Fields 19 in the prior art and in the environment of the present invention can correct bursts of eleven bits or less. The Back-up Field 21 contains a pure error detection code primarily to prevent mistaken "corrections" induced by the Fire Code Check Field 19.

When both the Fire Code Check Field 19 and the Back-up Code Check Field 21 contain cyclic codes a problem develops which is detected and avoided by the present invention. In a cyclic code an end-around shift, right or left always produces another code vector which appears error-free. Thus a loss of synchronization, caused, for example, by a defect which adds an extraneous one to the string of ones 13 in the framing bits 15 thereby causing a right data shift will in the normal course of events be corrected (mistakenly) by the Fire Code 19 and the mistaken correction not detected by the Back-up Code 21. A more detailed discussion of this problem and its solution by the present invention follows.

For purposes of illustration and explanation of certain characteristics of cyclic codes, consider the cyclic code generated by the polynomial $X^3+X+1$ as shown in tabular format in FIG. 2. The code vector is seven bits long and contains four information bits and three check bits. FIG. 2 lists all sixteen code vectors in order of increasing magnitude of the data bits. In order to better illustrate the cyclical nature of the code, the code vectors are rearranged in tabular format as shown in FIG. 3. Note in FIG. 3 that four closed cycles exist. Cycle A consists solely of the zero vector, which as illustrated always maps back onto itself. Cycle B consists of seven vectors. A shift-one-right of the seventh vector maps back to the first vector in the cycle. Like cycle B, cycle C consists of seven vectors and is a closed cycle. Cycle D, the all ones vector, maps back onto itself. The natural length of any cyclic code is the maximum possible bit length of the data plus check fields. The natural length depends on the polynomial from which the code is generated. The natural length of the code shown in FIG. 2 and FIG. 3 is seven bits. However, it is common in data processing environments to implement shortened cyclical codes. For example, the length of the code shown FIG. 2 and FIG. 3 may be shortened from seven to six bits by selecting a subset of eight vectors from FIG. 2, each vector having a leading zero. Deletion of the leading zero results in a shortened code consisting of eight vectors each six bits long. The shortening of the code in the present example only partially destroys the cyclical property, see FIG. 3. The only closed cycle remaining is the trivial one, the zero vector. The boxed in vectors within cycles B and C are open cycles; that is, after just a few shifts the cycling stops and does not map back onto the first vector. It is seen that cycling can occur as long a zero is being shifted in and a zero is being shifted out. It is evident that the cycling which occurs in the shortened code must occur within a closed cycle of the natural length code. Referring to Cycle B in FIG. 3, one can see that two right shifts map the first six element vector of the Cycle B into the third vector. Conversely, two left shifts map the third vector into the first.

A generalized statement relating to the above condition is as follows: for a shortened cyclical code the necessary and sufficient conditions for a shift 1 (right or left) resulting in another code vector is that (1) a "zero" is shifted out of the vector when (2) a "zero" is shifted into the vector. When these conditions are met then an error-correcting code cannot detect the shift. If only condition (1) is met, then the error-correcting code will detect the error (the "one" shifted into the vector) and sensing that the vector differs from a code vector in only one bit position, will change that "one" to a "zero".

Another possible shift is that a "one" is being shifted out while either a "zero" or "one" is being shifted in. The result is not close to being a code vector; however, in the unlikely event that a mistaken correction has occured it should be detected by the Back-up Code since cycling in the code vector would have been interrupted.

The error-correcting Fire Code indicated in FIG. 1 is a shortened cyclical code. The code vector of length 1472 bits consists of 1440 message data bits and 32 Fire Code Check bits. Natural length is 42987 bits, which means that 41,515 leading zeroes have been deleted. However, as in the example above, while non-trivial closed cycles no longer exist, there are numerous open cycles. In FIG. 4 this is illustrated for some code vectors with small data magnitudes. It can be seen that a sequence of shift-one-right maps "10" onto "5", "5" onto "2" and "2" onto "1". Many other similar sequences exist. FIG. 5 illustrates the appending of the remaining 24 Back-up Code Check bits to comprise a full 1496 bit code. Assume that a 1440 bit message consisting of "1011" followed by 1436 zeroes ("a" in FIG. 5) has been written along with 56 check bits (32 Fire Code Check bits plus 24 Back-up Code Check bits) and that upon reading this 1496 bit code an extra framing bit (see FIG. 1), a "one", is inserted in the most significant bit position. The result would be essentially a shift-one-right ("b" in FIG. 5). Except for the most significant bit, which is a "one", the result is identical to "c" in FIG. 5; "c" being a vector in the same open cycle as "a". In such a situation the Fire Code would cause a sensing of the existence of a 1472 bit vector which differs from a code vector in only the first bit position. Accordingly, the Fire Code "corrects" the most significant bit giving "c" which is a code vector in the 1496 bit code. Consequently, the Back-up code is not able to detect the mistaken correction.

The data field for the 1496 bit code consists of the 1440 message bits and the 32 bit Fire Code Check bits. Since this is also a shortened cyclic code, the previous statement on the necessary and sufficient conditions for a shift one (right or left) resulting in another code vector also applies here. Thus, trouble (an undetected mistaken correction) can strike if the unshifted vector had zeroes at boundaries "A" and "B" in FIG. 5.

In one embodiment of the present invention, encoded data (see FIG. 1) is transformed prior to storage, see FIG. 6. A start detect circuit 61 is activated as a unit of encoded data is being written into storage 63. The output 65 of the start detect circuit 61 initiates a count mechanism 67 which is clocked or otherwise enabled to keep account of the number of bits of the encoded data being written to storage 63. Certain bits of the encoded data are preselected to be inverted (i.e., complemented). Preferably, for the data format depicted in FIG. 1, bits one (1) and seventeen (17) of the Fire Code Check Field are selected. The preselected bit locations are fed from a complement bit location circuit 69, (which may in its most simplified form be merely hardwired) to be compared in a compare mechanism 71 with the bit count of count mechanism 67. A logical one or true signal is generated upon coincidence detection by the compare mechanism 71. The true signal is combined with a write signal which is at a logical one or true state when data is being written to storage 63 in AND gate 73. The output of the AND gate 73 is fed as one input 75 of an exclusive-Or gate 77 which is receiving encoded data. The output of the exclusive-Or gate 77 is fed to the storage 63 which may be implemented as a disk or other digital storage mechanism. The above-described operation effects a complement or inversion of two bits in the encoded data.

When the data is read from storage 63 the inverse complement operation occurs, see FIG. 7. The output of the compare mechanism 71 is combined with a READ signal in AND gate 79. The output of AND gate 79 is fed as one input 81 of exclusive-OR circuit 83 which is receiving encoded data and sending the encoded data for checking and decoding. If synchronization has been maintained in the storage medium 63 then the bits complemented during writing will have been recomplemented during reading. Else, the bits complemented during writing will remain complemented and the bits complemented during reading will also remain complemented thus providing the checking circuits with an easily detectable error signifying loss of synchronization in the storage medium 63.

Figure 8:
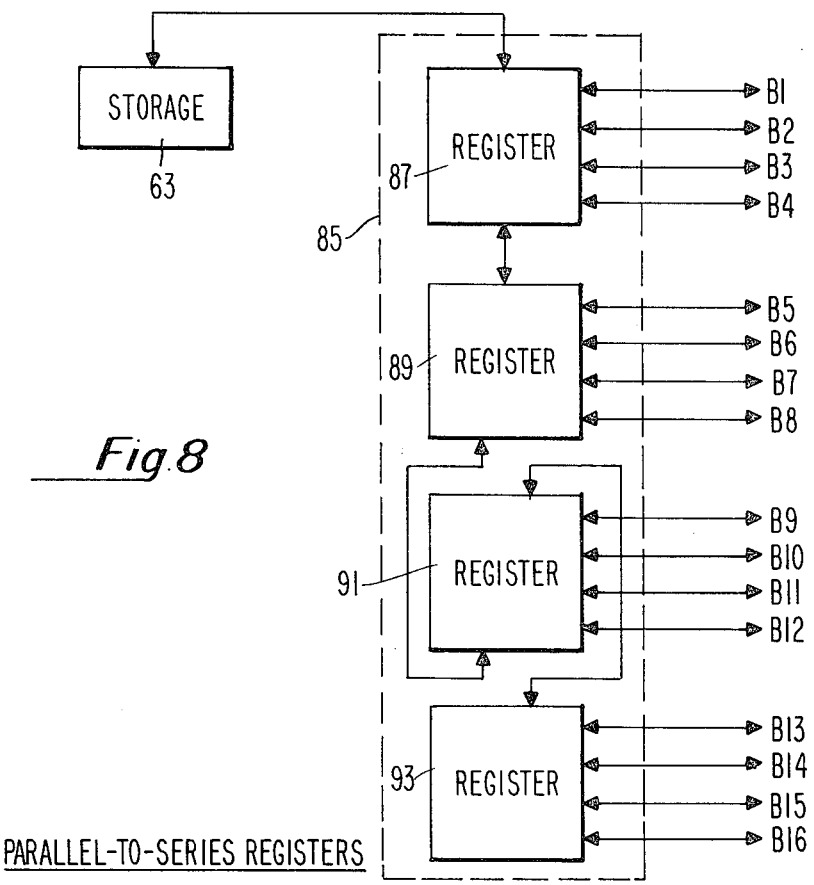
FIG. 8 is an illustration of an alternate embodiment of the present invention wherein data bits are reversed in sequence rather than inverted in order to flag loss of synchronization by the operation of the present invention.

An alternate embodiment is depicted in FIG. 8 wherein data is fed in sixteen bit parallel to a parallel-to-series register array 85 having registers 87, 89, 91 and 93 each processing 4 bits apiece. The connections to one of the registers, as shown register 91, is reversed so that the parallel-to-series conversion of the array 85 writes four bits in reverse order into the storage medium 63. Upon reading, the array 85 functions in reverse to convert the series output of the storage medium 63 into a parallel output comprising bits B1 through B16. If synchronization is maintained the four bits reversed during storage will be restored to proper sequence during reading. If synchronization is lost, then some of the bits reversed during writing will not be restored during reading and other bits will be reversed during reading. Again this compounded error will be easily detectable by error checking circuits and a loss of synchronization will not be mistakenly corrected and not detected as an error by cyclic redundancy checking codes.

What has been shown and described in the foregoing is a method and apparatus for insuring that a loss of synchronization will not be erroneously "corrected" by cyclic redundancy checking codes. Those skilled in the art realize that obvious changes and modifications can be made to the above described embodiments. For example, the method and apparatus for providing synchronization loss tolerance is also effective in a data system having a data word or message protected by a single cyclic redundancy code rather than the dual code as described. Also, although bits to be transformed have been described as being in the Check Code Field, they could be located in the data field. Further, although the transformations above-described involve only bit complementation and bit sequence reversal, other transformations and/or bit permutations may be utilized singularly or in combination.

Finally, it is realized that synchronization loss can occur during the transmission or communication of data as well as during the storage of the same and that the above-described method and apparatus applies readily to data transmission to achieve synchronization loss tolerance. After encoding but prior to transmission of data a transformation in the manner above-described is performed and following the transmission but prior to decoding or checking the inverse transformation is performed in the manner above-described. Thus, for example, the present invention can be used to provide synchronization loss tolerance in data transmission systems between terminal devices, peripheral units, bit-serial interfaces and the like.

Thus, while many different embodiments of the above-described invention could be made without departing from the scope thereof, it is intended that the above-description not be taken in the limiting sense but be interpreted as illustrative of embodiments of the invention for particular applications.

What is claimed is:

1. A method of preventing mistaken corrections due to synchronization loss during storage of an encoded binary data message, said encoded binary data message comprising a message field, a first cyclic type check field for error detection and correction, and a second cyclic type check field for error detection and for detection of mistaken corrections induced by said first cyclic type check field, said method comprising the steps of:
   performing data bit sequence reversals of a plurality of certain specific bit locations in said encoded binary data message but not at other bit locations;
   writing into storage said encoded binary data message having said data bit sequence reversals performed at said plurality of specific bit locations;
   reading from storage said encoded binary bit data message having said data bit sequence reversals performed at said plurality of specific bit locations; and
   performing reverse data bit sequence reversals of said plurality of certain specific bit locations in said encoded binary data message such that said encoded binary data message is not identical to said encoded binary data message prior to said performance of data bit sequence reversals when synchronization has not been maintained thereby indicating that proper error correction cannot be made.

2. The method according to claim 1 wherein each specific bit location in said plurality thereof is located in said first cyclic type check field.

3. An apparatus for preventing mistaken corrections due to synchronization loss during storage of an encoded binary data message, said encoded binary data message comprising a message field, a first cyclic type check field for error detection and correction, and a second cyclic type check field for error detection and for detection of mistaken corrections induced by said first cyclic type check field, said apparatus comprising:
   means for performing data bit sequence reversals of a plurality of certain specific bit locations in said encoded binary data message but not at other bit locations;
   means for writing into said storage said encoded binary data message having said binary data bit sequence reversals performed at said plurality of specific bit locations;
   means for reading from storage said encoded binary data message having said data bit sequence reversals performed at said plurality of specific bit locations; and
   means coupled to said reading means for performing reverse data bit sequence reversals of said plurality of certain specific bit locations in said encoded binary data message such that said encoded binary data message is not identical to said encoded binary data message prior to said performance of data bit sequence reversals when synchronization has not been maintained thereby indicating that proper error correction cannot be made.

4. The apparatus according to claim 3 wherein each specific bit location in said plurality thereof is located in said first cyclic type check field.

5. A method of preventing mistaken corrections due to synchronization loss during storage of an encoded binary data message, said encoded binary data message comprising a message field and a cyclic type check field for at least error detection, said method comprising the steps of:
   performing data bit sequence reversals of a plurality of certain specific bit locations in said encoded binary data message but not at other bit locations;
   writing into storage said encoded binary data message having said data bit sequence reversals performed at said plurality of specific bit locations;
   reading from storage said encoded binary data message having said data bit sequence reversals performed at said plurality of specific bit locations; and performing reverse data bit sequence reversals of said plurality of certain specific bit locations in said encoded data message such that said encoded binary data message is not identical to said encoded binary data message prior to said performance of data bit sequence reversals when synchronization has not been maintained thereby indicating that proper error correction cannot be made.

6. The method according to claim 5 wherein each specific bit location in said plurality thereof is located in said cyclic type check field.

7. An apparatus for preventing mistaken corrections due to synchronization loss during storage of an encoded binary data message, said encoded binary data message comprising a message field and a cyclic type check field for at least error detection, said apparatus comprising:

means for performing data bit sequence reversals of a plurality of certain specific bit locations in said encoded binary data message but not at other bit locations;

means for writing into said storage said encoded binary data message having said data bit sequence reversals performed at said plurality of specific bit locations; and means coupled to said reading means for performing reverse data bit sequence reversals of said plurality of certain specific bit locations in said encoded binary data message such that said encoded binary data message is not identical to said encoded binary data message prior to said performance of data bit sequence reversals when synchronization has not been maintained thereby indicating that proper error correction cannot be made.

8. The apparatus according to claim 7 wherein each specific bit location in said plurality thereof is located in said cyclic type check field.

9. A method of preventing mistaken corrections due to synchronization loss during transmission of encoded binary data message, said encoded binary data message comprising a message field and a cyclic type check field for at least error detection, said method comprising the steps of:

performing data bit sequence reversals of a plurality of certain specific bit locations in said encoded binary data message but not at other bit locations;

transmitting said encoded binary data message having said data bit sequence reversals performed at said plurality of specific bit locations;

receiving said encoded binary data message having said data bit sequence reversals performed at said plurality of specific bit locations; and performing reverse data bit sequence reversals of said plurality of certain specific bit locations in said encoded binary data message such that said encoded binary data message following said performance of data bit sequence reversals is not identical to said encoded binary data message prior to said performance of data bit sequence reversals when synchronization has not been maintained thereby indicating that proper error correction cannot be made.

10. The method according to claim 9 wherein each specific bit location in said plurality thereof is located in said cyclic type check field.

11. An apparatus for preventing mistaken corrections due to synchronization loss during transmission of an encoded binary data message, said encoded binary data message comprising a message field and a cyclic type check field for at least error detection, said apparatus comprising:

means for performing data bit sequence reversals of a plurality of certain specific bit locations in said encoded binary data message but not at other bit locations;

means for transmitting said encoded binary data message having said data bit sequence reversals performed at said plurality of specific bit locations;

means for receiving said encoded binary data message having said data bit sequence reversals performed at said plurality of specific bit locations; and means coupled to said receiving means for performing reverse data bit sequence reversals of said plurality of certain specific bit locations in said encoded binary data message having said data bit sequence reversals such that said encoded binary data message is not identical to said encoded binary data message prior to said performance of data bit sequence reversals when synchronization has not been maintained thereby indicating that proper error correction cannot be made.

12. The apparatus according to claim 11 wherein each specific bit location in said plurality thereof is located in said cyclic type check field.

* * * * *